(12) United States Patent
Akiba et al.

(10) Patent No.: US 11,971,520 B2
(45) Date of Patent: Apr. 30, 2024

(54) OPTICAL DEVICE AND MANUFACTURING METHOD THEREFOR

(71) Applicant: CANON KABUSHIKI KAISHA, Tokyo (JP)

(72) Inventors: Hideo Akiba, Utsunomiya (JP); Kyohei Ishikawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 385 days.

(21) Appl. No.: 16/854,619

(22) Filed: Apr. 21, 2020

(65) Prior Publication Data
US 2020/0341170 A1 Oct. 29, 2020

(30) Foreign Application Priority Data

Apr. 26, 2019 (JP) .............................. JP2019-085961

(51) Int. Cl.
| | | |
|---|---|---|
| C23C 14/08 | (2006.01) | |
| C23C 14/00 | (2006.01) | |
| C23C 14/06 | (2006.01) | |
| C23C 14/18 | (2006.01) | |
| C23C 14/34 | (2006.01) | |
| G02B 1/115 | (2015.01) | |

(52) U.S. Cl.
CPC .......... *G02B 1/115* (2013.01); *C23C 14/0036* (2013.01); *C23C 14/0694* (2013.01); *C23C 14/08* (2013.01); *C23C 14/18* (2013.01); *C23C 14/3464* (2013.01)

(58) Field of Classification Search
CPC . C23C 14/08; C23C 14/0036; C23C 14/3464; C23C 14/352; C23C 14/0694; G02B 1/115; G02B 1/113; G02B 1/11; B32B 2307/416; B32B 2551/00
See application file for complete search history.

(56) References Cited

U.S. PATENT DOCUMENTS

| | | | |
|---|---|---|---|
| 4,927,239 A | 5/1990 | Melzig | |
| 6,761,959 B1 | 7/2004 | Bonkowski | |
| 11,346,983 B2 * | 5/2022 | Matsumoto | ............ G02B 1/115 |
| 2002/0024731 A1 * | 2/2002 | Muraguchi | .......... G02B 5/3025 |
| | | | 359/489.19 |
| 2004/0081807 A1 * | 4/2004 | Bonkowski | .......... G03H 1/0256 |
| | | | 428/195.1 |
| 2004/0114067 A1 * | 6/2004 | Kubomura | ........... G02B 6/0055 |
| | | | 349/62 |

(Continued)

FOREIGN PATENT DOCUMENTS

| | | |
|---|---|---|
| CN | 1360544 A | 7/2002 |
| CN | 104142525 A | 11/2014 |

(Continued)

*Primary Examiner* — Jaehwan Oh
(74) *Attorney, Agent, or Firm* — CANON U.S.A., INC. IP Division (57) ABSTRACT

An optical device includes, in sequence, a surface formed of a metal oxide, a samarium oxide-containing layer in contact with the surface formed of a metal oxide, and a magnesium fluoride-containing layer in contact with the samarium oxide-containing layer so as to suppress optical absorption resulting from high-rate sputter deposition of a magnesium fluoride-containing layer on a surface formed of a metal oxide.

30 Claims, 5 Drawing Sheets

(56) References Cited

U.S. PATENT DOCUMENTS

| | | | | |
|---|---|---|---|---|
| 2007/0082224 A1* | 4/2007 | Friz | ...................... | C01G 23/003 |
| | | | | 428/689 |
| 2014/0327876 A1* | 11/2014 | Hugenberg | .............. | G02B 1/14 |
| | | | | 427/535 |
| 2016/0059528 A1* | 3/2016 | Wolk | ........................ | B32B 7/12 |
| | | | | 427/407.1 |
| 2016/0313473 A1 | 10/2016 | Akiba | | |
| 2017/0190161 A1* | 7/2017 | Wolk | .................... | H01L 21/022 |
| 2018/0306949 A1* | 10/2018 | Matsumoto | ......... | C03C 17/3452 |

FOREIGN PATENT DOCUMENTS

| | | | |
|---|---|---|---|
| CN | 105970171 | A | 9/2016 |
| CN | 108732659 | A | 11/2018 |
| GB | 968253 | A | 9/1964 |
| JP | H06337303 | A | 12/1994 |
| JP | 9-291358 | A | 11/1997 |
| JP | 2000-171609 | A | 6/2000 |
| JP | 2000297366 | A | 10/2000 |
| JP | 2007-156362 | A | 6/2007 |
| JP | 2015-114599 | A | 6/2015 |
| WO | 2019/058825 | A1 | 3/2019 |

\* cited by examiner

OPTICAL DEVICE AND MANUFACTURING METHOD THEREFOR

BACKGROUND OF THE INVENTION

Field of the Invention

The present disclosure relates to an optical device and a manufacturing method therefor.

Description of the Related Art

There is a known structure in which a fluoride layer, such as an aluminum fluoride ($AlF_3$) layer or a magnesium fluoride ($MgF_2$) layer, is formed on a surface of an optical device, such as a lens or a mirror, to serve as an antireflection layer.

A vacuum evaporation method offers advantages such as simple device structure and high film deposition rate, and thus antireflection layers have been formed mostly by the vacuum evaporation method. However, in recent years, there has been increasing demand for film deposition by a sputtering method that is superior to the vacuum evaporation method from the viewpoints of reproducibility, film variation control, low-temperature deposition, etc.

A sputtering method is a method of forming films by sputtering a material in an atomic state using charged particles, such as a plasma. In film deposition by a sputtering method, it is difficult to control the reaction between the sputter material and a substrate material and to control the damage inflicted by the charged particles on the substrate and the film. For example, when a film containing a fluoride is formed on a surface of a metal oxide by a sputtering method, the metal oxide is reduced by fluorine, and absorption occurs on the longer wavelength side with respect to the wavelength corresponding to the band gap. As a result, performance of the optical device is degraded.

Japanese Patent Laid-Open No. 9-291358 discloses a method for forming an oxide layer between a glass substrate and a fluoride layer ($MgF_2$ layer), the oxide layer containing at least one of $SiO_2$, $ZrO_2$, and $Al_2O_3$, in order to suppress optical absorption that occurs at the interface between the glass substrate and the fluoride layer. Japanese Patent Laid-Open No. 2015-114599 discloses a method for forming, as a base for a fluoride layer ($MgF_2$ layer), a magnesium oxyfluoride layer represented by $Mg_xO_yF_z$ (where $0.01 \leq z/x \leq 1.45$ and $0.01 \leq z/y \leq 3.17$).

At the site of production, in order to increase productivity, it is desirable to increase the density of the plasma near the substrate and speed up film deposition by increasing the input power and decreasing the distance between the target and the substrate. However, when a fluoride layer is deposited at a high speed by the methods described in the aforementioned patent documents, separation and optical absorption occur at the interface between the fluoride layer and the substrate. The optical absorption that occurs at the interface is considered to be attributable to local breaking of atomic bonds caused by irradiation of the interface with electrons in the plasma and accelerated high-energy charged particle beams. As described above, the known art rarely provides optical devices with satisfactory characteristics by high-rate film deposition.

SUMMARY OF THE INVENTION

The present disclosure provides an optical device that can suppress optical absorption and that has high optical transmittance in a visible light region, by forming a magnesium fluoride-containing layer on a surface of a metal oxide by high-rate sputter deposition.

An aspect of the present disclosure provides an optical device that includes, in sequence, a surface formed of a metal oxide; a samarium oxide-containing layer in contact with the surface formed of a metal oxide; and a magnesium fluoride-containing layer in contact with the samarium oxide-containing layer.

Another aspect of the present disclosure provides an optical device manufacturing method that includes, in sequence, a step of forming a samarium oxide layer or an ytterbium oxide layer on a base member having a surface formed of a metal oxide by reactive sputtering using a metal target formed of samarium or ytterbium; and a step of forming a magnesium fluoride layer by reactive sputtering using a metal target formed of magnesium.

Further features of the present disclosure will become apparent from the following description of exemplary embodiments with reference to the attached drawings.

DESCRIPTION OF THE EMBODIMENTS

An optical device and a manufacturing method therefor according to the present disclosure will now be described with reference to the drawings. Although examples in which the gas types and the film materials are limited are described in this embodiment, the scope of the present invention is not limited by these examples.

Optical Device

Figure 1:
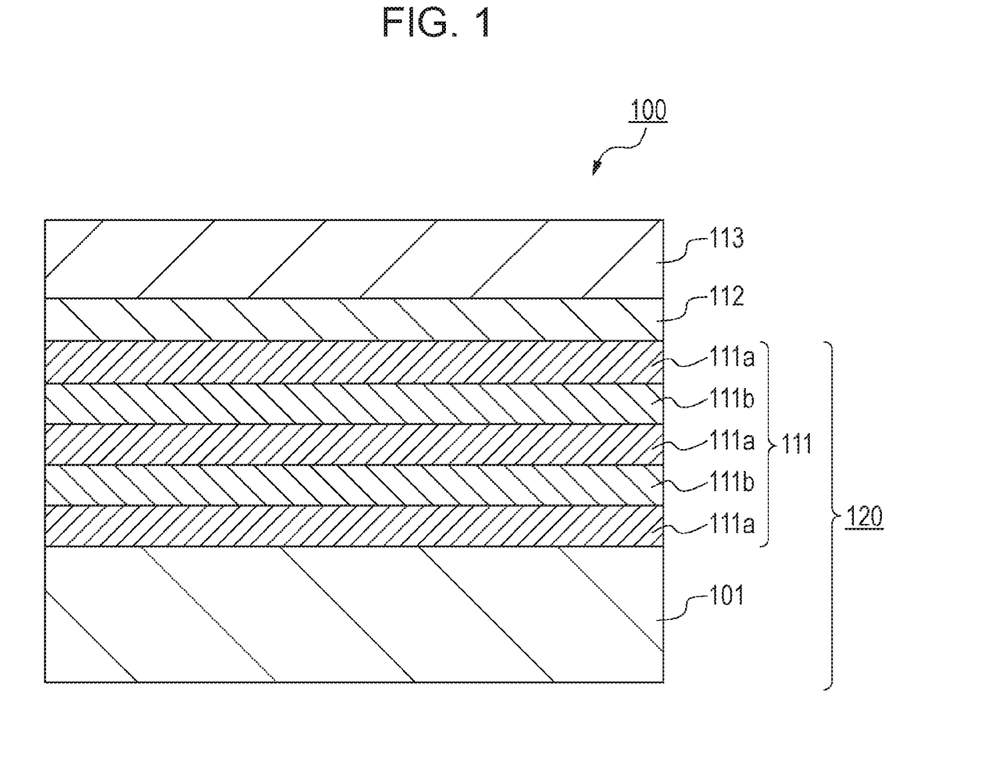
FIG. 1 is a schematic sectional view of an optical device according to an embodiment of the present disclosure.

FIG. 1 is a schematic sectional view of an optical device according to the present disclosure. An optical device 100 includes, in sequence, a base member 120 constituted by a substrate 101 and a layered structure 111 disposed on the substrate 101, a buffer layer 112, and a magnesium fluoride-containing layer 113.

Calcium fluoride crystals, quartz glass, silicon, glass, a resin, or the like can be used as the substrate 101. The substrate 101 can have various shapes depending on the usage of the optical device, and may have a flat shape as illustrated in FIG. 1, or a curved surface.

The layered structure 111 includes multiple layers of metal oxides stacked on top of each other. The layered structure 111 is obtained by alternately stacking layers 111a having relatively high refractive indices (high-refractive-index layers) and layers 111b having relatively low refractive indices (low-refractive-index layers), and is formed to prevent reflection at the surface of the substrate 101. Specifically, the high-refractive-index layers 111a are metal oxide layers having a refractive index of 1.75 or more and 2.70 or less, and contain zirconium oxide, tantalum oxide, niobium oxide, titanium oxide, or the like. The low-refractive-index layers 111b are metal oxide layers having a refractive index of 1.35 or more and 1.75 or less, and contain silicon oxide, aluminum oxide, or the like. The materials and layer thickness for the high-refractive-index layers 111a and the low-refractive-index layers 111b may be determined according to the optical design of the optical device.

The magnesium fluoride-containing layer 113 is a layer that decreases the difference in refractive index between air and the layered structure 111 to enhance the antireflection performance, and is a layer that contains magnesium fluoride ($MgF_2$) as a main component. The refractive index of the magnesium fluoride-containing layer 113 at d line (wavelength: 587.6 nm) is preferably 1.40 or less and more preferably 1.38 or less. The magnesium fluoride content of the magnesium fluoride-containing layer 113 is preferably 80 mass % or more and more preferably 90 mass % or more.

As described above, when a magnesium fluoride-containing layer 113 is directly formed on the base member 120 that includes the layered structure 111 and has a surface formed of a metal oxide, optical absorption occurs at the interface between the metal oxide surface and the magnesium fluoride-containing layer 113, and the performance of the optical device is degraded. Thus, in the present disclosure, a buffer layer 112 is provided between the base member 120 and the magnesium fluoride-containing layer 113 so that the buffer layer 112 is in contact with both the base member 120 and the magnesium fluoride-containing layer 113. In other words, the optical device includes, in sequence from the substrate 101 side, a metal oxide layer contained in the layered structure 111, the buffer layer 112, and the magnesium fluoride-containing layer 113.

The buffer layer 112 is a samarium oxide-containing layer or an ytterbium oxide-containing layer. The samarium oxide-containing layer is a layer that contains samarium oxide ($Sm_2O_3$) as a main component, and the samarium oxide content is preferably 80 mass % or more and more preferably 90 mass % or more. Similarly, the ytterbium oxide-containing layer is a film that contains ytterbium oxide ($Yb_2O_3$) as a main component, and the ytterbium oxide content is preferably 80 mass % or more and more preferably 90 mass % or more.

In order to suppress optical absorption that occurs at the interface between the base member 120 and the magnesium fluoride-containing layer 113, the buffer layer 112 must be a continuous film. On the basis of the thin film growth process (nuclei growth process), it is considered that, at a film thickness of 3.0 nm or more, stable nuclei connect to one another and form a continuous film. The optical device is generally used in a visible light region of 350 to 800 nm. The basic unit of the physical film thickness used in the optical thin film design is $\lambda/4n$ where $\lambda$ represents the wavelength of the incident light and n represents the refractive index of the film, and the film thickness that is actually employed is from $\lambda/4n$ to ten times $\lambda/4n$ at most. Since the refractive index of the samarium oxide-containing layer and the ytterbium oxide-containing layer at the longest wavelength $\lambda=800$ nm in the wavelength region of the visible light is about 1.9 to 2.0, it is considered that the film thickness employed as the optical thin film is 1.0 μm or less. Thus, the layer thickness of the buffer layer 112 can be 3.0 nm or more and 1.0 μm or less.

Although an optical device that includes, in sequence from the substrate 101 side, a layered structure 111, a buffer layer 112, and a magnesium fluoride-containing layer 113 is described with reference to FIG. 1, the structure of the optical device is not limited to this. Depending on the optical performance required of the optical device, a structure that uses a base member that does not include a layered structure 111 is also possible. When the layered structure 111 is omitted and when the substrate 101 is formed of a metal oxide such as glass, the surface of the base member, that is, the surface of the substrate 101, is formed of a metal oxide, and thus optical absorption occurs if a magnesium fluoride-containing layer 113 is directly formed on the substrate 101. Thus, even with the structure that includes a base member 120 that does not include the layered structure 111, a samarium oxide-containing layer that serves as a buffer layer 112 may be formed between the base member 120 and the magnesium fluoride-containing layer 113.

It is possible to impart a reflection enhancing function, a filtering function, and the like to the optical device of the present disclosure in addition to the antireflection function by adjusting the material and film thickness of the layers constituting the layered structure 111.

Deposition System

Figure 2:
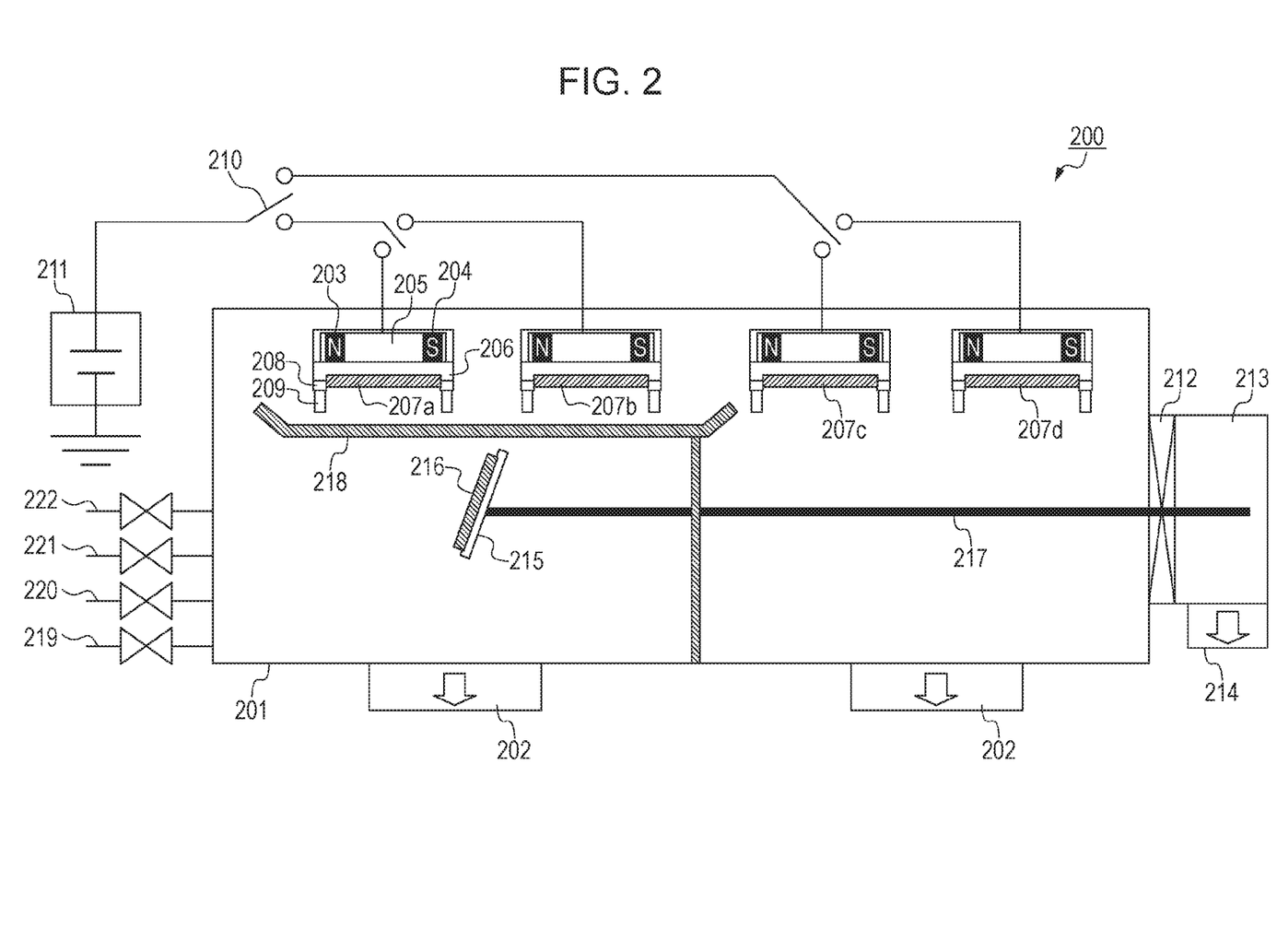
FIG. 2 is a diagram illustrating an example of a deposition system suitable for realizing an optical device f the present disclosure.

FIG. 2 is a schematic view of a deposition system 200 suitable for manufacturing the optical device of the present disclosure. The deposition system 200 includes a deposition chamber 201, inside of which is maintained in a vacuum state, and an exhaust system 202 that includes a vacuum pump for evacuating the deposition chamber 201, etc. The deposition chamber 201 is equipped with multiple target units 203 in the inside. Although a structure equipped with multiple target units 203 is illustrated in FIG. 2, the number of target units may be one.

Each of the target units 203 is equipped with a cooling box 205 that contains a magnet 204 inside and that can cool the target with circulating cooling water. The magnet 204 is arranged so that a magnetic field is formed in a direction parallel to the target surface. The cooling water flowing in the cooling box 205 is adjusted to a desired temperature by a chiller not shown in the drawing, and is supplied to the cooling box 205 at a particular flow rate to keep the surface temperature of the target constant. The cooling box 205 is equipped with a backing plate 206 that serves as a cathode electrode, and one of targets 207a to 207d is fixed to the backing plate 206. An anode electrode 209 is disposed along the peripheral portion of the backing plate 206 with an insulating material 208 therebetween. The anode electrode 209 and the cathode electrode (backing plate) 206 are connected to a power supply 211 via a switch 210, and are configured to supply electric power to one of the targets 207a to 207d. When the targets 207a to 207d are respectively composed of different materials, electric power can be supplied to the desired one of the targets 207a to 207d by switching the switch 210 so that multiple types of films can be deposited in the same chamber.

The power supply 211 may be a DC power supply. If a high-frequency AC power supply is used as the power supply 211, a large self bias voltage occurs in a substrate 216. This self bias voltage accelerates the cations of the target material, and the cations incident on the substrate damage the substrate and the films formed on the substrate.

In particular, the magnesium fluoride layer is susceptible to damage, and optical absorption in the visible light region occurs easily. In other words, when a DC power supply is used as the power supply 211, damage on the deposited films can be suppressed, and an optical device with further decreased optical absorption can be obtained.

The deposition chamber 201 is connected to a load lock chamber 213 via a gate valve 212, and an exhaust system 214 different from that of the deposition chamber 201 is installed in the load lock chamber 213. A substrate holder 215 that holds the substrate 216 can change the position in the deposition chamber 201 and can move between the load lock chamber 213 and the deposition chamber 201 when operated by a moving mechanism 217. In this manner, the substrate 216 can be carried in and out without exposing the inside of the deposition chamber 201 to the atmospheric air. The substrate holder 215 is also equipped with an angle adjusting mechanism and a rotating mechanism so that the relative angle between the sputter surface of one of the targets 207a to 207d and the substrate holding surface of the substrate holder 215 can be changed. In addition, a shielding plate 218 that blocks particles sputtered from the target is installed between the substrate holder 215 and the targets 207a to 207d so that deposition does not start until discharge has stabilized. In order to accurately control the film thickness, the shielding plate 218 may be openable and closable at high speeds.

Furthermore, the deposition chamber 201 is configured so that a deposition gas can be supplied through a gas supplying system from a sputtering gas introduction port 219 and reactive gas introduction ports 220 to 222. An inert gas such as Ar, He, Ne, Kr, or Xe is supplied as a sputtering gas from the sputtering gas introduction port 219. Depending on the type of the target and the material to be deposited, a reactive gas, for example, oxygen ($O_2$), fluorocarbon gas, hydrogen ($H_2$), or the like, can be introduced from the reactive gas introduction ports 220 to 222. The flow rate, the purity, and the pressure of each gas can be highly accurately controlled by a mass flow controller and a gas purifier. When there are many reactive gases to be introduced, more reactive gas introduction ports may be provided.

Next, a deposition method that uses the deposition system 200 illustrated in FIG. 2 is described. The targets 207a to 207d are selected according to the type of the thin film to be formed. Here, as one example, the case in which niobium (Nb) for depositing $Nb_2O_5$ is used in the target 207a and silicon (Si) for depositing $SiO_2$ is used in the target 207b is described. Furthermore, magnesium (Mg) for depositing $MgF_2$ is used in the target 207c, and samarium (Sm) for depositing $Sm_2O_3$ is used in the target 207d. In addition, an Ar gas can be introduced from the sputtering gas introduction port 219, an $O_2$ gas can be introduced from the reactive gas introduction port 220, a fluorocarbon gas can be introduced from the reactive gas introduction portion 221, and a $H_2$ gas can be introduced from the reactive gas introduction port 222.

After preliminary preparation, such as installing targets, is completed, the substrate holder 215 is moved into the load lock chamber 213, the gate valve 212 is closed, and the exhaust system 202 is driven to evacuate the deposition chamber 201 to a pressure of about $1\times10^{-3}$ Pa. While the gate valve 212 is in a closed state, the load lock chamber 213 is opened, and the substrate 216 is mounted onto the substrate holder 215.

The position of the substrate holder 215 is preliminarily adjusted by the angle adjusting mechanism so that the film thickness distribution within a surface of the substrate 216 onto which a film is to be formed (hereinafter this surface is referred to as a "deposition surface") is constant. In depositing a magnesium fluoride ($MgF_2$) layer, the position must be adjusted so that the deposition surface of the substrate 216 is outside the projection plane of the target in a normal line direction of the sputter surface and so that the film thickness distribution within the surface of the substrate 216 is constant.

When a fluoride film is deposited by reactive sputtering using a typical parallel plate-type magnetron sputtering device, a thin compound film, such as a magnesium fluoride film, is formed on a target surface due to the influence of the reactive gas. When the surface (sputter surface) on which a fluorine-containing compound film is formed is sputtered, negative ions are partly formed, and the formed negative ions are accelerated by the ion sheath voltage and turn into negative ions having large kinetic energy and directivity. Since these negative ions are accelerated in a direction substantially perpendicular to the target surface, placing the substrate within the projection plane in the normal line direction of the sputter surface causes the negative ions having large kinetic energy to collide with the substrate, inflicting extensive damage on the substrate or the film formed on the substrate surface. Thus, the substrate is arranged so that the lines normal to the sputter surface of the target do not intersect the deposition surface, in other words, the substrate is arranged so as not to overlap a region where the target is projected in a normal line direction with respect to the sputter surface. In this manner, damage on the film can be suppressed even when negative ions are formed.

Next, the shielding plate 218 is put in a closed state so that a film is not deposited on the deposition surface of the substrate 216, and Ar is introduced into the deposition chamber 201 from the sputtering gas introduction port 219. Next, the switch 210 is operated to connect the power supply 211 to the cathode electrode (backing plate) 206 on which the target 207a for forming a high-refractive-index material, niobium oxide film to be formed first is installed, and a particular DC voltage is applied. At the target 207a, glow discharge occurs (plasma is generated), and Ar turns into cations. These cations collide with the target 207a electrically connected to the cathode electrode 206, and atoms are sputtered off from the target 207a.

A plasma is stable even when the pressure inside the deposition chamber 201 is about several tenths of Pa. The reason why a plasma is generated at such a low pressure is that electrons undergo cyclotron motion within a plane perpendicular to the magnetic field due to the magnetron effect of the magnet 204 housed in the cooling box 205, and thus the electron density near the target 207a can be increased. Moreover, since the magnetron of the magnet 204 increases the electron density near the target 207a and decreases the electron temperature and electron density near the substrate 216, the magnetron also has effects of suppressing entry of the charged particles into the substrate and decreasing the damage on the film.

Next, an $O_2$ gas is introduced as a reactive gas for depositing niobium oxide ($Nb_2O_5$), which is a high-refractive-index material, into the deposition chamber 201 through the reactive gas introduction port 220.

The introduced reactive gas oxidizes the surface of the target 207a, and the surface is readily covered with an insulating material. This insulating material may become charged up, and may undergo dielectric breakdown due to ions and electrons, possibly resulting in abnormal discharge. Once abnormal discharge occurs, foreign substances mix into the film, giving a film having a rough surface. Thus, an AC voltage of about several kHz can be superposed on the DC voltage to cancel the charges and prevent abnormal discharge. If the frequency to be superposed is excessively increased, a self bias voltage occurs in the substrate as described above, causing the cations to enter the substrate and damage the film. However, as long as the frequency superposed is 100 kHz or less, the influence of the damage on the film can be confined within an allowable range.

The pressure inside the deposition chamber 201 during deposition is maintained at 0.1 Pa or more and 3.0 Pa or less by adjusting the valves and mass flow controllers respectively installed in the exhaust system 202, the sputtering gas introduction port 219, and the reactive gas introduction port 220. A film having a rough surface and a low density is formed if the pressure is excessively increased, and discharge drop occurs if the pressure is excessively decreased. After it is confirmed that the discharge voltage has stabilized, the shielding plate 218 is opened to start deposition. The film thickness is controlled by the deposition time on the basis of the relationship between the deposition time and the film thickness studied in advance.

Deposition of a low-refractive-index-material silicon oxide ($SiO_2$) layer using the target 207b can be performed by applying a DC voltage to the target 207b by operating the switch 210, and the process thereafter can be the same as the deposition using the target 207a. In depositing $SiO_2$ also, an $O_2$ gas is introduced as a reactive gas into the deposition chamber 201.

Deposition of a magnesium fluoride ($MgF_2$) layer using the target 207c can be performed by applying a DC voltage to the target 207c by operating the switch 210, and the process thereafter can be the same as the deposition using the target 207a. However, during the deposition, an $O_2$ gas and a fluorocarbon gas are introduced as the reactive gases.

Deposition of a samarium oxide ($Sm_2O_3$) layer using the target 207d can be performed by applying a DC voltage to the target 207d by operating the switch 210, and the process thereafter can be the same as the deposition using the target 207a. However, during the deposition, an $O_2$ gas and a $H_2$ gas are introduced as the reactive gases. When $H_2$ is introduced, a multilayer film having further low optical absorption can be stably obtained even when magnesium fluoride is deposited on the samarium oxide layer. This is presumably because dangling bonds of Sm generated due to the failure of the reaction between Sm and O react with H to form a stable H-containing $Sm_2O_3$ film, and generation of dangling bonds, such as bond cleavage, is suppressed even when electrons in the plasma and accelerated high-energy charged particle beams irradiate the interface.

In the present disclosure, after a number of niobium oxide layers and a number of silicon oxide layers that correspond to the optical design are alternately stacked, a samarium oxide layer is deposited on a niobium oxide layer while introducing $O_2$ and $H_2$ as reactive gases, and then a magnesium fluoride layer is formed. According to this method, generation of electronic defects (reduction) in the samarium oxide layer during formation of the magnesium fluoride layer can be prevented, and occurrence of optical absorption at the interface can be suppressed. As a result, even when high-rate deposition using charged particles, such as a sputtering method, is performed, a fluoride-containing multilayer film that has low absorption in the visible region can be obtained. The same applies to when an ytterbium oxide-containing layer is formed as the buffer layer 112.

A schematic sectional view of a thus-obtained optical device 100 is shown in FIG. 1. The optical device 100 includes, in sequence, a base member constituted by a substrate 101 and a layered structure 111 formed of a metal oxide and disposed on the substrate 101, a buffer layer 112 containing samarium oxide, and a magnesium fluoride-containing layer 113. The layered structure 111 is constituted by high-refractive-index layers, i.e., niobium oxide layers 111a, and low-refractive-index layers, i.e., silicon oxide layer 111b, stacked in an alternating manner, and the uppermost surface of the layered structure 111 is a niobium oxide layer 111a. As illustrated in FIG. 1, since a buffer layer 112 containing samarium oxide is interposed between the magnesium fluoride-containing layer 113 and the niobium oxide layer 111a constituting the uppermost surface of the layered structure 111, the optical absorption is suppressed, and an optical device having high transmittance and excellent properties can be obtained. This optical device can exhibit a reflection enhancing function, a filtering function, and the like in addition to the antireflection function.

EXAMPLES

Examples 1 to 5

A sample having a structure that includes a substrate formed of silicon oxide ($SiO_2$), and a samarium oxide ($Sm_2O_3$) layer and a magnesium fluoride ($MgF_2$) layer formed in that order on the substrate was prepared by using the deposition system illustrated in FIG. 2 while varying the amount of $H_2$ introduced during deposition of samarium oxide layer.

A Mg target was used as the target 207c, a Sm target was used as the target 207d, and a flat $SiO_2$ substrate was used as the substrate 216. Fluorocarbon "HFC-245fa (1,1,1,3,3-pentafluoropropane: $CHF_2CH_2CF_3$)", $O_2$, and $H_2$ were used as the reactive gases.

First, a $Sm_2O_3$ layer was deposited. A washed substrate 216 was installed in the load lock chamber 213, and the chamber was evacuated to $1\times10^{-3}$ Pa or less. Upon completion of the evacuation, the substrate 216 was carried into the deposition chamber 201 by the substrate holder 215 via the gate valve 212, and was placed in a deposition position inside the deposition chamber 201. At this stage, the distance between the target 207d and the substrate 216 was about 80 mm. The shielding plate 218 was closed, 420 sccm of Ar was introduced through the sputtering gas introduction port 219, 100 sccm of $O_2$ was introduced through the reactive gas introduction port 220, and $H_2$ was introduced through the reactive gas introduction port 222. The amount of introduced $H_2$ was varied within the range of 0 to 100 sccm as indicated in Table, and samples of Examples 1 to 5 were prepared. The pressure inside the deposition chamber 201 was about 0.3 to 0.4 Pa.

A 1500 W sputtering power was applied to the cathode electrode (backing plate) 206 on which the target 207d was installed so as to generate a magnetron plasma on the surface of the target 207d. At the same time, a 5 kHz rectangular voltage that reverses the polarity of the target surface was superposed to cancel the charges on the target surface so that a stable discharge can be maintained.

Discharging was continued for a while, and after the discharge state had stabilized, the shielding plate 218 was opened to start deposition. The film thickness was controlled to about 100 nm by controlling the deposition time on the basis of the relationship between the deposition time and the film thickness studied in advance. Upon reaching the deposition time, the shielding plate 218 was closed, supply of gases and application of power were stopped, and the deposition of a $Sm_2O_3$ film was ended.

Next, a MgF$_2$ layer was deposited on the Sm$_2$O$_3$ layer on the substrate 216. First, the switch 210 was operated so that the target to which the DC power was applied was switched from the Sm metal target 207d to the Mg metal target 207c. The substrate 216 was arranged so as not to overlap the region where the target 207c is projected in a normal line direction with respect to the sputter surface and so that the film thickness direction within the deposition surface of the substrate 216 was constant. In this manner, the influence on the substrate 216 from the negative ions generated on the surface of the target 207c and accelerated by the cathode voltage can be suppressed. Ar was introduced through the sputtering gas introduction port 219 at a rate of 300 sccm, O$_2$ was introduced through the reactive gas introduction port 220 at 50 sccm, and HFC-245fa was introduced through the reactive gas introduction port 221 at 20 sccm. A 3000 W sputtering power was applied to the cathode electrode (backing plate) 206, and, at the same time, a 5 kHz rectangular voltage that reverses the polarity of the surface of the target 207c was superposed to generate a magnetron plasma. Discharging was continued for a while, and after the discharge state had stabilized, the shielding plate 218 was opened to start deposition. A film having a thickness of about 30 nm was deposited by controlling the deposition time.

Table indicates the optical absorption at 450 nm for each of the samples of Examples 1 to 5 that were prepared under the same experimental conditions except for the flow rate of H$_2$. The optical absorption was calculated on the basis of the reflectance and the transmittance of each sample measured with a commercially available reflectance/transmittance spectrometer. A sample of Comparative Example 1 was prepared as in Example 1 except that the Sm$_2$O$_3$ layer was not deposited; however, separation occurred at the interface between the surface of the SiO$_2$ substrate and the MgF$_2$ layer. Thus, a sample of Comparative Example 2 was prepared by depositing a MgF$_2$ layer under the same conditions as in Example 1 after a Nb$_2$O$_5$ layer was deposited to 100 nm on a surface of the SiO$_2$ substrate, and the optical absorption of this sample was calculated as in other examples. The results of Examples 1 to 5 and Comparative Examples 1 and 2 are indicated in Table. Considering the applicability to optical devices, samples with an optical absorption less than 0.2% were rated A, samples with an optical absorption 0.2% or more but less than 1.0% were rated B, and samples with an optical absorption of 1.0% or more or that underwent film separation were rated C.

TABLE

| | Film structure | Rate of H$_2$ introduced during deposition of Sm$_2$O$_3$ [sccm] | Optical absorption [%] | Rating |
|---|---|---|---|---|
| Example 1 | SiO$_2$/Sm$_2$O$_3$/MgF$_2$ | 0 | 0.6 | B |
| Example 2 | SiO$_2$/Sm$_2$O$_3$/MgF$_2$ | 10 | 0.4 | B |
| Example 3 | SiO$_2$/Sm$_2$O$_3$/MgF$_2$ | 30 | 0.2 | B |
| Example 4 | SiO$_2$/Sm$_2$O$_3$/MgF$_2$ | 50 | 0.1 | A |
| Example 5 | SiO$_2$/Sm$_2$O$_3$/MgF$_2$ | 100 | 0.02 | A |
| Comparative Example 1 | SiO$_2$/MgF$_2$ | — | — | C |
| Comparative Example 2 | Nb$_2$O$_5$/MgF$_2$ | — | 3 | C |

The table shows that depending on the flow rate of H$_2$ introduced during deposition of the MgF$_2$ layer on the Sm$_2$O$_3$ layer, the value of optical absorption changes. In Example 1 in which H$_2$ was not introduced, an optical absorption of about 0.6% occurred, but when deposition was conducted by introducing H$_2$, the optical absorption decreased with the increasing rate of introduction. At a H$_2$ introduction rate exceeding 50 sccm, excellent optical characteristics suitable for optical devices are obtained. At a H$_2$ introduction rate exceeding 100 sccm, optical absorption rarely occurs, and particularly excellent optical characteristics are obtained.

Among five samples indicated in Table, the sample of Example 1 in which H$_2$ gas was not introduced during deposition of the Sm$_2$O$_3$ layer and a sample of Example 5 in which H$_2$ gas was introduced at a rate of 100 sccm were analyzed to determine the bonding state at the interface between the Sm$_2$O$_3$ layer and the MgF$_2$ layer by X-ray photoelectron spectroscopy (XPS analysis). Analysis was carried out by etching the samples with Ar until a position where Mg, F, and Sm were simultaneously detected was reached, that is, until the interfacial region between the Sm$_2$O$_3$ layer and the MgF$_2$ layer was exposed. The analytical conditions were as follows.

Analytic method: X-ray photoelectron spectroscopy (XPS)
Analyzer: Quantera SXM (ULVAC PHI)
X-ray used: Al K-α monochromatic X-ray (1487 eV)/25 W/15 kV/100 μmφ
Neutralizing: both electron gun and argon ion gun were used
Detected spectrum: Survey spectrum
(Binding energy BE=0 to 1150 eV/pass energy PE=280 keV)
Narrow spectrum
(Sm3d5/2, O1s/PE=112 keV)

Figure 3:
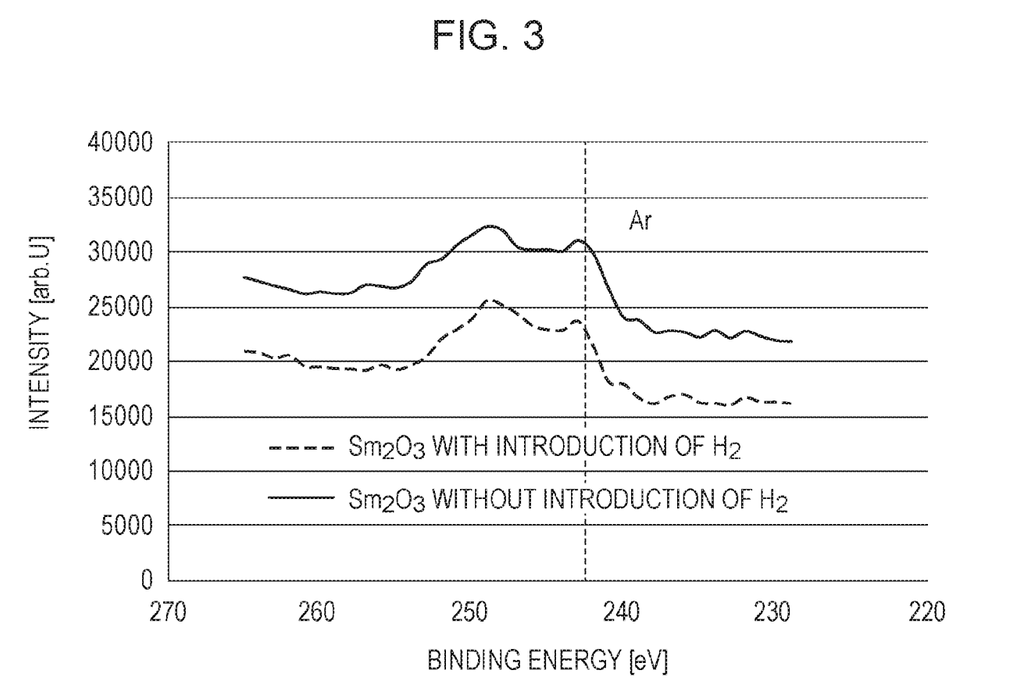
FIG. 3 is a graph in which some binding energy region in a Survey spectrum of an Ar2p3/2 peak of a $Sm_2O_3$ layer is extracted for a sample in which a $H_2$ gas was introduced during deposition and a sample in which $H_2$ gas was introduced at a rate of 100 sccm.

FIG. 3 indicates an extract of some portion of binding energy region in a Survey spectrum of the Ar2p3/2 peak of the Sm$_2$O$_3$ layer for each of Examples 1 and 5. Since these layers were deposited by sputtering, the Ar2p3/2 peak was observed around a binding energy of 242 eV, and this confirmed that the layers contained Ar. In the present disclosure, "around 242 eV" means the range of 242 eV±1.5 eV, and for other binding energy also, "around" means the range of ±1.5 eV.

Figure 4:
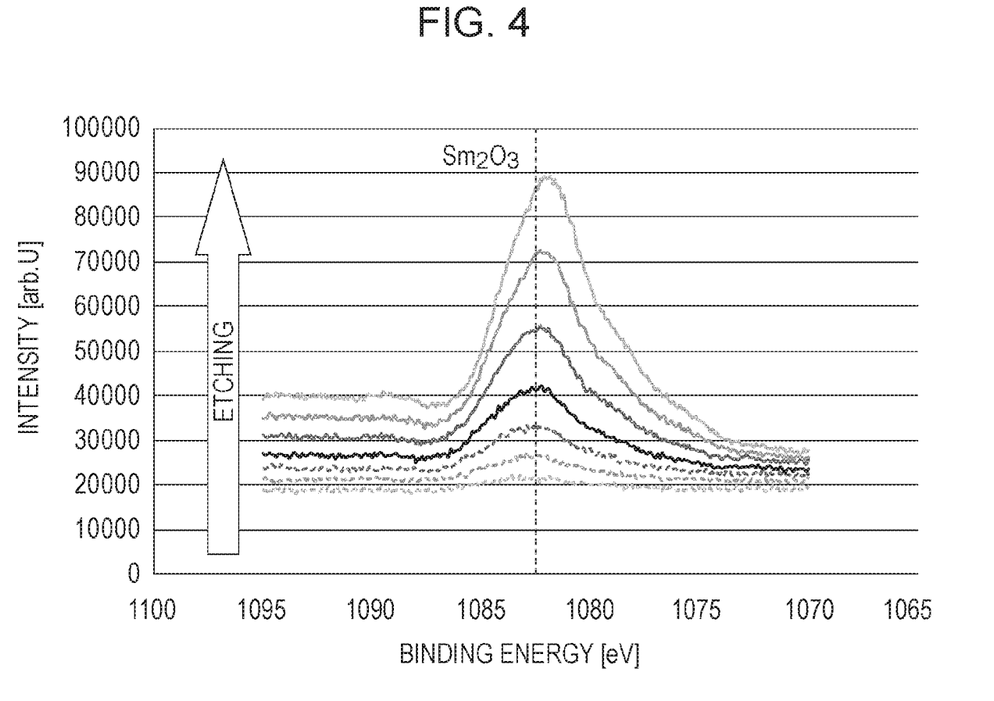
FIG. 4 indicates a narrow spectrum in the depth direction of a Sm3d5/2 peak around the interface between a $Sm_2O_3$ layer and a $MgF_2$ layer when a $H_2$ gas is introduced at a rate of 100 sccm during deposition of the $Sm_2O_3$ layer.
Figure 5:
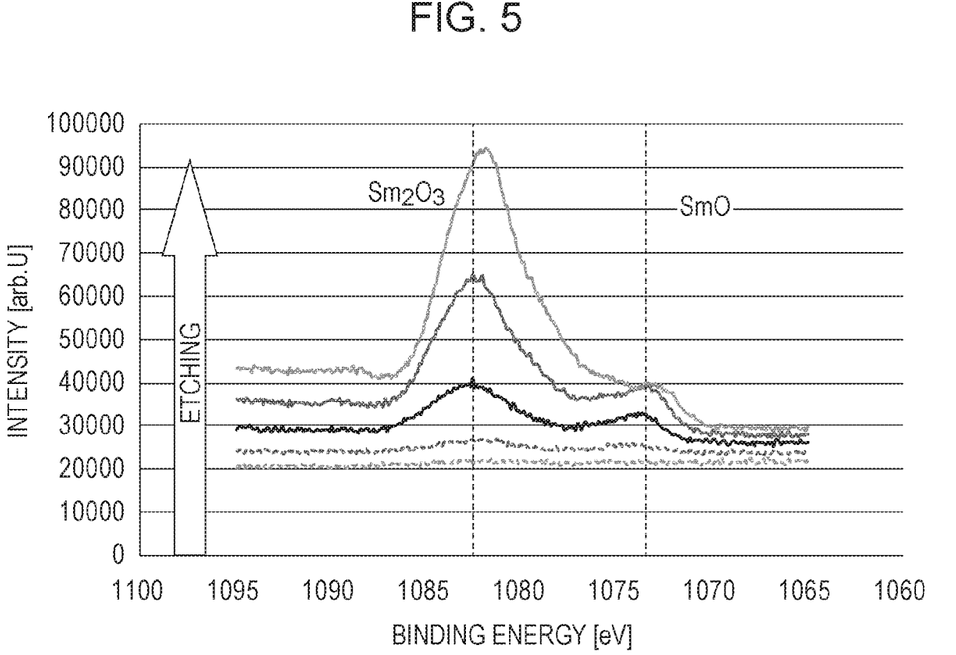
FIG. 5 indicates a narrow spectrum in the depth direction of the Sm3d5/2 peak around the interface between the $Sm_2O_3$ layer and the $MgF_2$ layer when a $H_2$ gas is not introduced during deposition of the $Sm_2O_3$ layer.

FIG. 4 indicates a narrow spectrum in the depth direction of the Sm3d5/2 peak around the interface between the Sm$_2$O$_3$ layer and the MgF$_2$ layer in Example 5. FIG. 5 indicates a narrow spectrum in the depth direction of the Sm3d5/2 peak in Example 1. In the present disclosure, "around the interface" means a range that spans from an etching depth at which the Sm peak (Sm3d5/2) was first observed to a depth reached by performing five cycles of ion etching after reaching the aforementioned etching depth when XPS analysis was performed while gradually etching from the surface of the MgF$_2$ layer.

Typically, the binding energy of Sm3d5/2 of Sm$_2$O$_3$ peaks around 1083 eV; however, when Sm$_2$O$_3$ is reduced, a peak appear on the lower energy side around 1073 eV. Presence or absence of the peak was determined on the basis of the following standard. A second derivative spectrum was obtained from the observed spectrum, and if a raised portion appeared at a certain position on the negative side at or below the threshold in the second derivative spectrum, it was judged that a peak is present at that position. In Example 1 in which the H$_2$ gas was not introduced during deposition of the Sm$_2$O$_3$ layer, Sm was reduced around the interface between the Sm$_2$O$_3$ layer and the MgF$_2$ layer, and a peak was observed on the low energy side. However, in Example 5 in which H$_2$ was introduced at a rate of 100 sccm, the peak resulting from reduction was not observed. These analytical results confirmed that, depending on the rate of the H$_2$ gas introduced during deposition, a layer containing samarium oxide deposited by introducing the H$_2$ gas has a high effect of suppressing reduction at the interface even when a magnesium fluoride layer is deposited thereon.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-085961, filed Apr. 26, 2019, which is hereby incorporated by reference herein in its entirety.

What is claimed is:

1. An optical device comprising:
   a base member with a surface formed of an oxide other than a samarium oxide;
   an oxide-containing layer in contact with the surface formed of the oxide; and
   a fluoride-containing layer in contact with the oxide-containing layer,
   wherein the oxide-containing layer contains samarium oxide.

2. The optical device according to claim 1, wherein the oxide-containing layer has a thickness of 3.0 nm or more and 1.0 μm or less.

3. The optical device according to claim 1, wherein the surface formed of the oxide is a surface of a layered structure obtained by stacking a plurality of oxide layers on a substrate.

4. The optical device according to claim 3, wherein the layered structure is obtained by alternately stacking oxide layers having a refractive index of 1.35 or more and less than 1.75 and oxide layers having a refractive index of 1.75 or more and 2.70 or less.

5. The optical device according to claim 4, wherein the oxide layers having the refractive index of 1.35 or more and less than 1.75 contain silicon oxide or aluminum oxide, and the oxide layers having the refractive index of 1.75 or more and 2.70 or less contain a member selected from the group consisting of zirconium oxide, tantalum oxide, niobium oxide, and titanium oxide.

6. The optical device according to claim 1, wherein the surface formed of the oxide is a surface of a substrate containing an oxide.

7. The optical device according to claim 1, wherein peaks are observed at around 242 eV and around 1083 eV but no peak is observed at around 1073 eV in a spectrum obtained by X-ray photoelectron spectroscopy (XPS) analysis of a region of the oxide-containing layer, the region being around an interface between the oxide-containing layer and the fluoride-containing layer.

8. An optical device manufacturing method comprising:
   a step of forming, by sputtering using a target containing samarium, an oxide-containing layer on a surface of a base member, the surface being formed of an oxide other than a samarium oxide; and
   a step of forming, by sputtering using a metal target, a fluoride-containing layer on the oxide-containing layer.

9. An optical device manufacturing method comprising:
   a step of forming, by sputtering using a target containing samarium or ytterbium, an oxide-containing layer on a surface of a base member, the surface being formed of an oxide other than a samarium oxide or a ytterbium oxide; and
   a step of forming, by sputtering using a metal target, a fluoride-containing layer on the oxide-containing layer, wherein, in the step of forming the oxide-containing layer, an oxygen-containing gas and a hydrogen-containing gas are introduced as reactive gases.

10. The optical device manufacturing method according to claim 9, wherein, in the step of forming the oxide-containing layer, the hydrogen-containing gas is introduced at a rate higher than 50 sccm.

11. The optical device manufacturing method according to claim 10, wherein, in the step of forming the oxide-containing layer, the hydrogen-containing gas is introduced at a rate higher than 100 sccm.

12. The optical device manufacturing method according to claim 8, wherein the surface of the base member on which the oxide-containing layer is formed, is formed by a step of alternately stacking, on a substrate, first oxide layers and second oxide layer,
   the first oxide layers contain silicon oxide or aluminum oxide and/or having a refractive index of 1.35 or more and less than 1.75, and
   the second oxide layers contain a member selected from the group consisting of zirconium oxide, tantalum oxide, niobium oxide and titanium oxide and/or having a refractive index of 1.75 or more and 2.70 or less.

13. The optical device manufacturing method according to claim 9, wherein the hydrogen-containing gas is a $H_2$ gas.

14. The optical device manufacturing method according to claim 8, wherein the surface of the base member on which the oxide-containing layer is formed is formed of silicon oxide.

15. The optical device according to claim 1, wherein the oxide forming the surface is silicon oxide, zirconium oxide, tantalum oxide, niobium oxide or titanium oxide.

16. The optical device according to claim 1, wherein the base member includes a first oxide layer and a second oxide layer having a refractive index less than the first oxide layer, and the oxide forming the surface of the base member is formed by the first oxide layer.

17. The optical device according to claim 1, wherein the oxide-containing layer contains the samarium oxide as a main component.

18. The optical device according to claim 1, wherein a samarium oxide content of the oxide-containing layer is 80 mass % or more.

19. The optical device according to claim 1, wherein the oxide-containing layer contains hydrogen.

20. The optical device according to claim 1, wherein the fluoride-containing layer contains magnesium fluoride.

21. The optical device according to claim 1, wherein the fluoride-containing layer contains magnesium fluoride as a main component.

22. The optical device according to claim 1, wherein a magnesium fluoride content of the fluoride-containing layer is 80 mass % or more.

23. An optical device comprising:
   a base member with a surface formed of an oxide other than ytterbium oxide;
   an oxide-containing layer in contact with the surface formed of the oxide; and
   a fluoride-containing layer in contact with the oxide-containing layer,
   wherein the oxide-containing layer contains ytterbium oxide and hydrogen.

24. The optical device according to claim 23, wherein an ytterbium oxide content of the oxide-containing layer is 80 mass % or more.

25. The optical device according to claim 23, wherein the fluoride-containing layer contains magnesium fluoride.

26. The optical device according to claim 23, wherein a magnesium fluoride content of the fluoride-containing layer is 80 mass % or more.

27. The optical device according to claim 23, wherein the oxide forming the surface is silicon oxide, zirconium oxide, tantalum oxide, niobium oxide or titanium oxide.

28. The optical device manufacturing method according to claim 8, wherein, the sputtering in the step of forming the oxide-containing layer is a reactive sputtering, and the target in the step of forming the oxide-containing layer is a metal target containing samarium.

29. The optical device manufacturing method according to claim 8, wherein, the metal target in the step of forming the fluoride-containing layer contains magnesium.

30. The optical device manufacturing method according to claim 9, wherein in the step of forming the fluoride-containing layer, the sputtering in the step of forming the fluoride-containing layer is a reactive sputtering in which fluorocarbon is introduced as reactive gas.

\* \* \* \* \*